United States Patent
Wei

(10) Patent No.: US 8,912,489 B2
(45) Date of Patent: Dec. 16, 2014

(54) DEFECT REMOVAL PROCESS

(71) Applicant: GLOBALFOUNDRIES, Inc., Grand Cayman (KY)

(72) Inventor: Yayi Wei, Altamont, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/783,562

(22) Filed: Mar. 4, 2013

(65) Prior Publication Data

US 2014/0246605 A1    Sep. 4, 2014

(51) Int. Cl.
*G03F 7/20* (2006.01)
*H01J 37/30* (2006.01)
*G03F 1/70* (2012.01)

(52) U.S. Cl.
CPC ............ *H01J 37/3007* (2013.01); *G03F 1/70* (2013.01)
USPC ............................ 250/307; 430/296; 716/112

(58) Field of Classification Search
CPC .............................................. H01L 21/67213
USPC .................. 438/437; 430/313, 302, 331, 296; 250/307; 716/112
See application file for complete search history.

(56) References Cited

U.S. PATENT DOCUMENTS

| | | | |
|---|---|---|---|
| 5,334,282 A * | 8/1994 | Nakayama et al. | 430/296 |
| 5,482,802 A * | 1/1996 | Celler et al. | 430/5 |
| 6,559,662 B1 * | 5/2003 | Yamada et al. | 324/754.22 |
| 7,858,271 B2 * | 12/2010 | Hiraki et al. | 430/5 |
| 2004/0133369 A1 * | 7/2004 | Pack et al. | 702/59 |
| 2005/0037271 A1 * | 2/2005 | Shishido et al. | 430/30 |
| 2005/0191561 A1 * | 9/2005 | Schilz et al. | 430/5 |
| 2008/0293832 A1 * | 11/2008 | Yokoi et al. | 516/98 |
| 2009/0075181 A1 * | 3/2009 | Ha | 430/5 |
| 2009/0253081 A1 * | 10/2009 | Abdallah et al. | 430/324 |
| 2011/0073782 A1 * | 3/2011 | Wieland | 250/492.22 |
| 2012/0053892 A1 * | 3/2012 | Matsuoka et al. | 702/167 |

* cited by examiner

*Primary Examiner* — Phillip A Johnston
*Assistant Examiner* — Kevin Chung
(74) *Attorney, Agent, or Firm* — Heslin Rothenberg Farley & Mesiti P.C.

(57) ABSTRACT

A process is provided for the removal of defects, for example, micro-bridging defects during device fabrication. In one aspect, a method includes: obtaining a wafer after lithography processing and exposing the wafer to at least one electron beam. In another aspect, a system includes: selecting a substrate with micro-bridging defects after the substrate undergoes lithography processing; preparing the substrate for exposure to at least one electron beam; and exposing the substrate to the at least one electron beam.

17 Claims, 3 Drawing Sheets

DEFECT REMOVAL PROCESS

FIELD OF THE INVENTION

The present invention generally relates to semiconductor devices and methods of fabricating semiconductor devices, and more particularly, to methods of removal of micro-bridging defects in a resist pattern during fabrication.

BACKGROUND OF THE INVENTION

During the semiconductor patterning process it is common for micro-bridging defects to occur. It is particularly common for micro-bridging defects to form in the resist patterns after the lithography process in advanced technology nodes, for example, nodes of approximately 32 nm and beyond. Micro-bridging defects include small connections between two adjacent lines in a photo-resist pattern, which may cross-link two or more resist patterns in close proximity leading to the creation of single-line opens after etching. The cross-linking of the resist patterns of micro-bridging defects may cause a serious decrease in the production yield of advanced integrated circuits.

Existing solutions for removing micro-bridging defects include increasing the dose of exposure to the wafer during the lithography process step. However, this method of removing micro-bridging defects requires changing the develop critical dimension (DCD) target, in addition, a new optical proximity correction (OPC) module is needed to address the DCD retargeting. An alternative existing solution includes using a "better" photo-resist material to prevent the micro-bridging defects. The "better" resist would have extraordinary image contrast. After exposure and develop, the edge of resist pattern would be clean and no line-edge roughness. However, this method of removing the micro-bridging defects requires an "ideal" photo-resist, which is not yet available.

Accordingly, a need exists for a process of removing micro-bridging defects after the lithography process during fabrication.

BRIEF SUMMARY

The shortcomings of the prior art are overcome and advantages are provided through the provision, in one aspect, of a method which includes: obtaining a wafer after lithography processing; and exposing the wafer to at least one electron beam.

In another aspect, a system which includes: selecting a substrate with micro-bridging defects after the substrate undergoes lithography processing; preparing the substrate for exposure to at least one electron beam; and exposing the substrate to the at least one electron beam.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Generally stated, disclosed herein is an enhanced method and system for removing micro-bridging defects in a resist pattern. The method includes, in one aspect, obtaining a wafer after lithography processing is completed and exposing the wafer to at least one electron beam. The system includes, in one aspect, selecting a wafer with micro-bridging defects after the wafer has undergone lithography processing, preparing the wafer for exposure to at least one electron beam, and exposing the wafer to the at least one electron beam.

Figure 1:
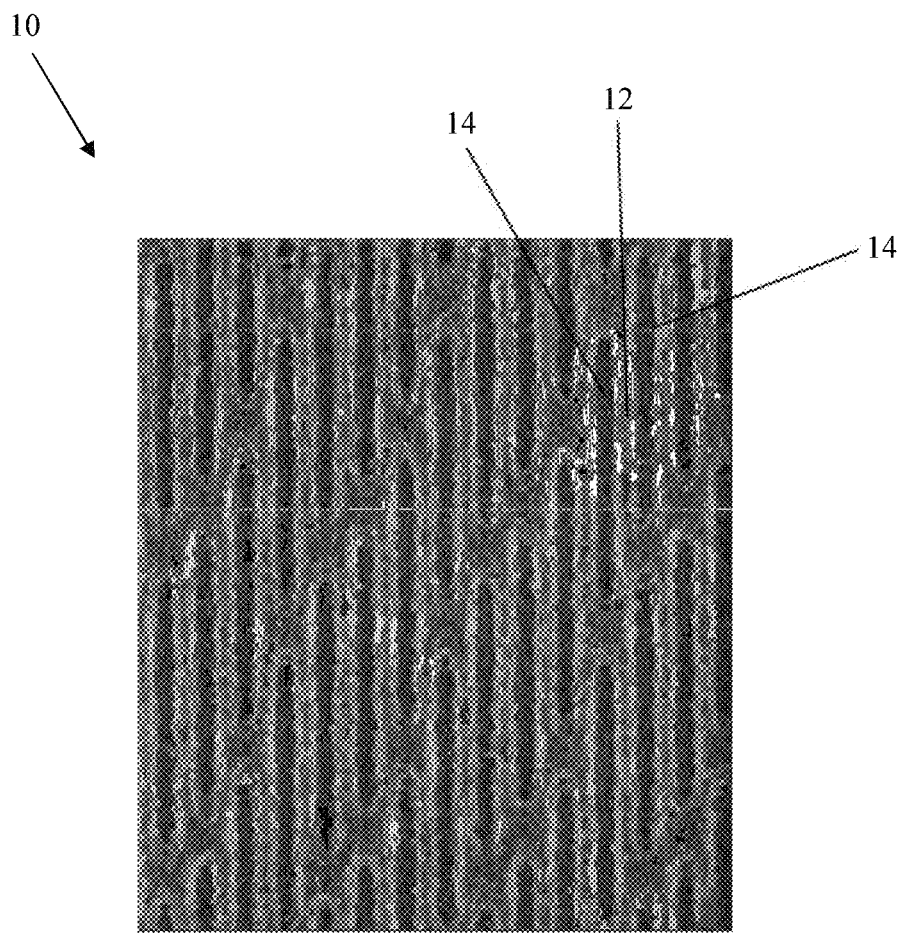
FIG. 1 is a scanning electron microscope image of a portion of a wafer after lithography processing, in accordance with one or more aspects of the present invention.

FIG. 1 depicts a scanning electron microscope image of a portion of a wafer or substrate 10 after lithography processing during semiconductor device fabrication. The terms "wafer" and "substrate" may be used herein interchangeably as they essentially describe the same type of device. Lithography processing uses a photo-resist or light sensitive film to define the patterns onto the wafer that identify where the wafer material needs to be removed or retained. During photo-resist developing in the lithography process the micro-bridging defects may be created between adjacent lines in the wafer patterns on the photo-resist material. As shown in FIG. 1, the wafer 10 includes a plurality of micro-bridging defects 12. The micro-bridging defects 12 create small connections between adjacent lines 14 in the photo-resist of the wafer 10. As the size of the features of the wafer patterns decrease, the micro-bridging defects may form easier during lithography processing. The micro-bridging defects cause major yield loses in advanced integrated circuit manufacturing.

Figure 2:
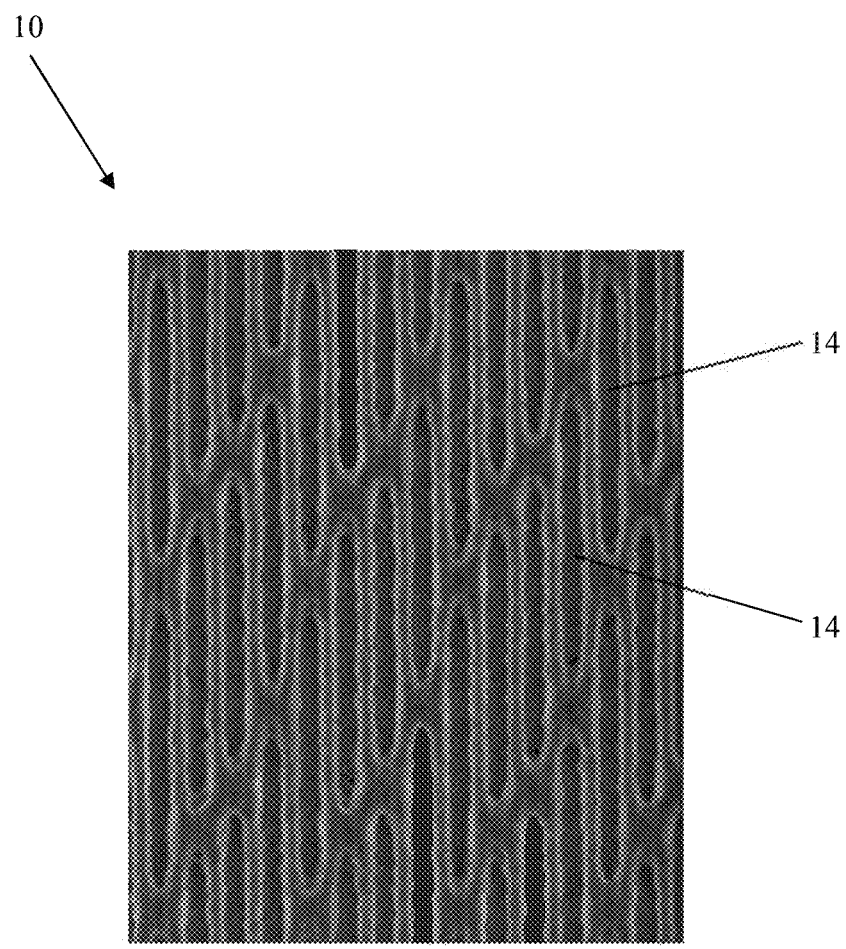
FIG. 2 is a scanning electron microscope image of the portion of the wafer of FIG. 1 after electron beam exposure, in accordance with one or more aspects of the present invention.
Figure 3:
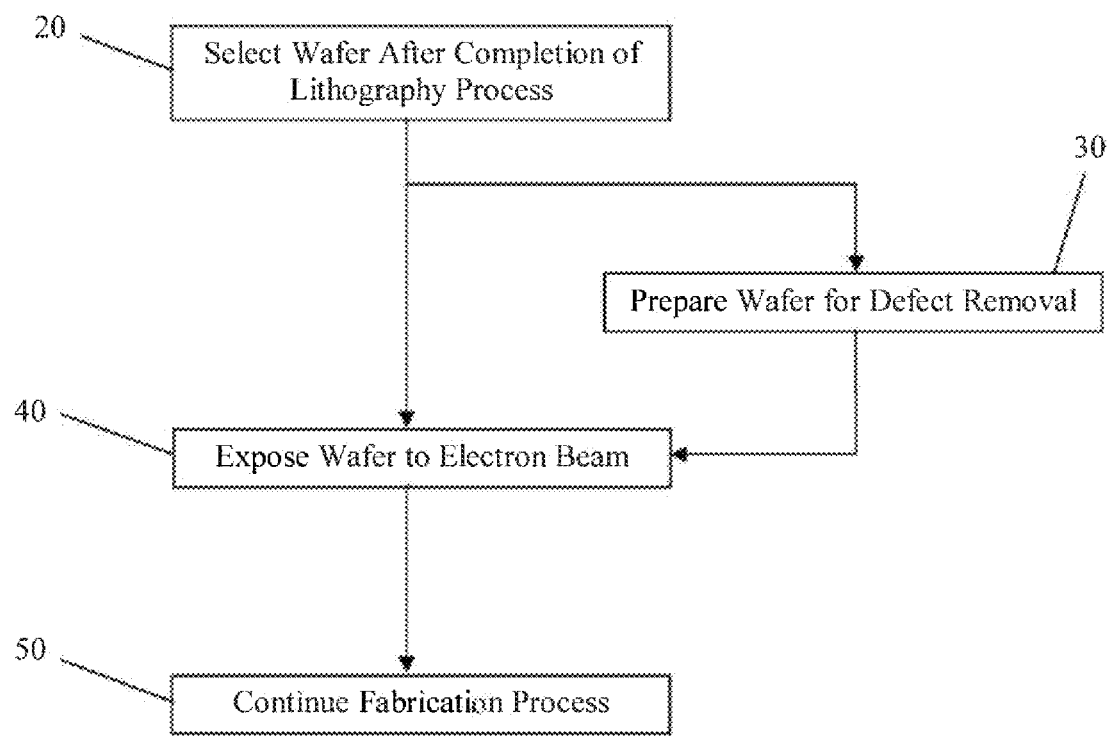
FIG. 3 depicts one embodiment of a process for removing micro-bridging defects from a wafer, in accordance with one or more aspects of the present invention.

FIG. 2 depicts a scanning electron microscope image of the wafer 10 after removal of the micro-bridging defects 12. A process overview of one embodiment of the defect removal method and system is disclosed herein and depicted in FIG. 3. As shown in FIG. 3, the defect removal process starts with obtaining a wafer which includes at least one resist pattern with micro-bridging defects 20, for example, the wafer 10 of FIG. 1. The micro-bridging defects 12 may have been created on the wafer 10 during the lithography process. The wafer 10 may then be prepared for defect removal 30. The wafer 10 will then be inserted into, for example, a critical dimension (CD) scanning electron microscope chamber. At least one electron beam, for example, a uniform electron beam, will be turned on to expose the wafer 10 to the at least one electron beam for a set period of exposure time 40. The period of exposure time is dependent upon the composition of the photo-resist material and the wafer material. The entire wafer 10 may be exposed to the at least one electron beam. The exposure of the wafer 10 to the at least one electron beam may remove the micro-bridging defects 12 without damaging the designed pattern of adjacent lines 14. After exposure of the electron beam is completed the wafer or substrate 10 may be removed from the chamber and the remaining steps of the fabrication process completed 50.

The at least one electron beam may have a current, for example, a beam current, and a voltage, for example, an acceleration voltage. The beam current may, for example, range from approximately 1 pA to 100 pA. The acceleration voltage may, for example, range from approximately 50V to 800V. The wafer may be exposed to the electron beam for a designated time of exposure, for example, the time of exposure may range from 1 s/die to 100 s/die, and depend on the die size and the properties of the resist. In a preferred embodiment, a wafer 10 with a photo-resist of 95 nm of TOK Pi6-133 may be exposed to an electron beam with a beam current of 10 pA, an acceleration voltage of 500 V, and the exposure time may be 10 s/die to remove the micro-bridging defects. It is contemplated that the presently disclosed defect removal process may be used with all photo-resist materials and wafer types by varying the properties of the at least one electron beam.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
    obtaining a wafer with a photo resist layer after lithography processing; and
    exposing the wafer with the photo resist layer to at least one electron beam using a critical dimension scanning electron microscope to remove micro-bridging defects from the photo resist layer;
    wherein the at least one electron beam is a uniform electron beam.

2. The method of claim 1, wherein the at least one electron beam is exposed using open frame flood exposure.

3. The method of claim 1, wherein the beam current is 10pA.

4. The method of claim 3, wherein the acceleration voltage is 500 V.

5. The method of claim 4, wherein the at least one electron beam includes a time of exposure of approximately 10 s/die.

6. A system, comprising:
    selecting a substrate with micro-bridging defects after the substrate undergoes lithography processing;
    preparing the substrate for exposure to at least one electron beam; and
    exposing the substrate to the at least one electron beam with a critical dimension scanning electron microscope to remove the micro-bridging defects.

7. The system of claim 6, wherein the at least one electron beam is uniform.

8. The system of claim 6, wherein the at least one electron beam is exposed using open frame flood exposure.

9. The system of claim 6, wherein the at least one electron beam includes a current and a voltage.

10. The system of claim 9, wherein the current ranges from approximately 1 pA to 100 pA.

11. The system of claim 10, wherein the voltage ranges from approximately 50 V to 800 V.

12. The system of claim 11, wherein the at least one electron beam includes an exposure time ranging from approximately 1 s/die to 100 s/die 13. The system of claim 9, wherein the current is 10 pA.

14. The system of claim 13, wherein the voltage is 500 V.

15. The system of claim 14, wherein the wafer is exposed to the at least one electron beam for an exposure time of approximately 10 s/die.

16. A method, comprising:
    obtaining a wafer after lithography processing; and
    exposing the wafer to at least one electron beam from a critical dimension scanning electron microscope to remove micro-bridging defects from the wafer.

17. The method of claim 1, wherein the at least one electron beam includes a beam current and an acceleration voltage, the beam current ranges from approximately 1 pA to 100 pA, the acceleration voltage ranges from approximately 50 V to 800 V, and the at least one electron beam includes a time of exposure ranging from approximately 1 s/die to 100s/die.

* * * * *